SEMICONDUCTOR TRANSLATING DEVICE
HAVING CONTROLLED GAIN
Filed Sept. 21, 1951

INVENTORS: W. SHOCKLEY
M. SPARKS
BY
ATTORNEY

Patented Dec. 23, 1952

2,623,105

UNITED STATES PATENT OFFICE 2,623,105

SEMICONDUCTOR TRANSLATING DEVICE HAVING CONTROLLED GAIN

William Shockley, Madison, and Morgan Sparks, Basking Ridge, N. J., assignors to Bell Telephone Laboratories, Incorporated, New York, N. Y., a corporation of New York Application September 21, 1951, Serial No. 247,676

6 Claims. (Cl. 175—366)

This invention relates to semiconductor signal translating devices and more particularly to such devices of the type known as transistors.

Transistors comprise, in general, a body of semiconductive material and three connections, designated the base, emitter and collector, thereto. In one class, of which the devices disclosed in the application Serial No. 35,423, filed June 26, 1948, now Patent 2,569,347, granted September 25, 1951 to W. Shockley and in Patent 2,502,488, granted April 4, 1950 to W. Shockley are illustrative, the collector includes a PN junction in the semiconductive body. Comprehensive discussions of such junction transistors appear in the article by W. Shockley in the Bell System Technical Journal, July 1949, page 435 and by W. Shockley et al. in the Physical Review, volume 83, page 151.

An important operating parameter for transistors is the current multiplication factor, which is commonly designated $\alpha$ and is defined as the ratio of change in collector current to change in emitter current for a constant collector voltage. Mathematically, $$\alpha=-\frac{\partial I_c}{\partial I_e}\bigg|V_c=\text{constant}$$

$I_c$ being the collector current, $I_e$ the emitter current and $V_c$ the collector potential. The factor $\alpha$ is dependent upon a number of effects and may be expressed as $$\alpha=\alpha_i\beta\gamma$$

where $\beta$=the fraction of the injected current reaching the collector $\gamma$=the fraction of the emitter current carried by injected carriers, and $\alpha_i$=the instrinsic $\alpha$, that is the ratio of change in collector current per unit change in minority carrier current arriving at the collector.

For a PN collector junction, the intrinsic factor, $\alpha_i$, is the ratio of the change in total current across the junction per unit minority carrier arriving at the junction, the minority carriers being electrons when the collector terminal is on the N side of the junction and holes when the collector terminal is on the P side of the junction.

The theoretical maximum for the intrinsic factor, $\alpha_i$, for an idealized PN junction is unity. This is a consequence of the assumption made for an idealized case that the minority carrier density is very small compared to the majority carrier density in the collector body. The factor $\beta$ is dependent upon the thickness of the zone opposite that on which the collector terminal appears, inasmuch as the diffusion of minority carriers through that zone varies, in general inversely, with the thickness. For example, in a transistor wherein the semiconductor is of NPN configuration, operation depends upon the diffusion of electrons through the P zone or region and the greater the thickness of this zone the smaller will be the number of electrons which reach the collector junctions. It is possible to design and construct NPN structures in which $\gamma\beta$ differs from unity by two per cent or less by making the P layer thin and keeping lifetimes long. Furthermore, the temperature coefficient of the deviation is relatively small for reasons described in the Physical Review, volume 83, page 158.

One general object of this invention is to improve the performance characteristics of transistors including PN junction collectors. More specifically, one object of this invention is to enable the attainment for a PN junction collector of a stable, intrinsic current multiplication factor of greater than unity.

In accordance with one feature of this invention, there is provided between the collector PN junction in and the collector terminal on the semiconductive body, a region or zone of the semiconductive material and of intrinsic conductivity. Such zone results in the establishment of a potential hook in the vicinity of the junction whereby the ratio of hole and electron currents at the junction is fixed at substantially the mobility ratio for carriers in the intrinsic zone or region. This leads to a stable, intrinsic factor, $\alpha_i$, for the junction of $$\alpha_i=1+\frac{1}{b}$$

where $b$ is the mobility ratio. This ratio is substantially independent of temperature.

The invention and the above noted and other features thereof will be understood more clearly and fully from the following detailed description with reference to the accompanying drawing in which:

Fig. 1 portrays an amplifier illustrative of one embodiment of this invention, wherein the transistor includes a junction emitter and a junction collector;

Figure 1:
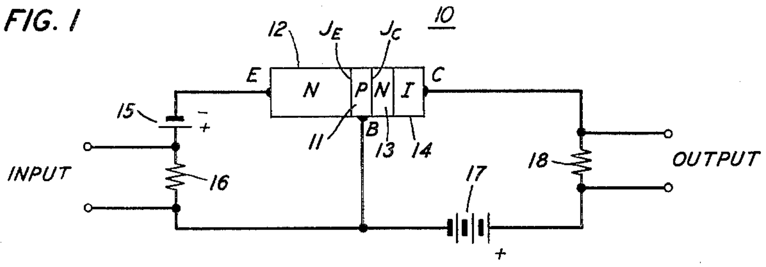

In the drawing, for ease of identification and understanding, the emitter, base and collector terminals have been designated as E, B and C respectively; also, the conductivity type of each of the zones in the semiconductive body has been indicated by appropriate characters, namely N=N-type, P=P-type and I=intrinsic.

Referring now to the drawing, the signal translating device illustrated in Fig. 1 comprises a semiconductive body 10, for example of germanium, having therein an intermediate zone 11 of P-type contiguous with two N zones 12 and 13 and forming junctions $J_E$ and $J_C$ therewith. The body includes also an intrinsic zone 14. Emitter, base and collector terminals are provided on the zones 12, 11 and 14 respectively.

Figure 2:
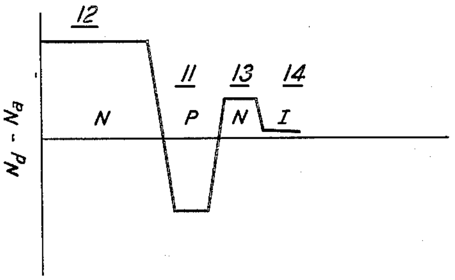
Fig. 2 is a diagram showing the relative excess donor and acceptor concentrations in the several zones of the semiconductive element of the transistor shown in Fig. 1.

The semiconductive body may be fabricated in the manner disclosed in the application Serial No. 168,184, filed June 15, 1950 of G. K. Teal. Briefly, in accordance with the method therein disclosed, a seed of germanium is dipped into a molten mass of germanium and withdrawn therefrom at a rate to draw some of the molten material along therewith. Concomitantly with the withdrawal step, the impurity balance in the melt is altered to effect a controlled variation in the conductivity or inversion in the conductivity type of the melt and, hence, of the withdrawn material. For example, if the melt is of N-type initially, it may be converted to P-type by adding an acceptor material, such as gallium, thereto and then reconverted to N-type by adding a donor material, such as antimony thereto, whereby successive portions of the crystal produced by withdrawal of the seed will be N-type, P-type and N-type respectively. To produce a body of the configuration illustrated in Fig. 1, advantageously the melt should be initially of high purity germanium wherein the donors and acceptors are substantially in effective balance so that the first withdrawn portion will be of intrinsic material, to provide the zone 14. Suitable initial material may have a resistivity of about 60 ohm centimeters. By addition of appropriate impurities as mentioned above, successive portions of the withdrawn material may provide zones, corresponding to zones 13, 11 and 12 in Fig. 1, having resistivities of say 10, 1 and 0.01 ohm centimeters respectively. In a typical construction, the zones 11, 12, 13 and 14 may be, respectively, .05, 0.2, .05 and 0.3 centimeter thick. The relative difference between donor ($N_d$) and acceptor ($N_a$) concentrations for such a construction is depicted in Fig. 2.

As shown in Fig. 1, the emitter junction $J_E$ is biased in the forward direction by a source 15 connected in series with an input impedance 16; the collector junction $J_C$ is biased in the reverse direction by a source 17 in series with a load indicated generally by the resistor 18. The emitter bias may be of the order of 0.1 volt and the collector bias of the order of 1 volt.

Figure 3:
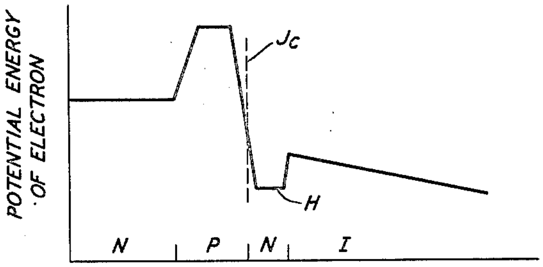
Fig. 3 is a graph illustrating the potential energy for electrons in the several zones of the semiconductive element shown in Fig. 1.

In brief, in the operation of the device illustrated in Fig. 1, by virtue of the bias across the junction $J_E$, electrons are injected across this junction into the P zone 11, pass through this zone, across junction $J_C$ and toward the collector terminal C. The potential energy for electrons in the several regions or zones is as portrayed in Fig. 3. When current flows in the device, there is established in the intrinsic region 14 a field tending to drive electrons to the right, in Fig. 1, and holes to the left. The ratio, in this zone or region, of the hole current to the electron current will be $$\frac{1}{b}$$

where $b$ is the mobility ratio of the two types of carriers in the bulk of the material constituting the zone 14. For germanium the ratio of electron mobility to hole mobility is about 2. If the same ratio of hole to electron current does not obtain at the collector junction $J_C$, holes or electrons will accumulate at the potential hook, indicated at H in Fig. 3, until the ratio noted is established at the junction. It can be shown, then, that there results at the collector junction an intrinsic multiplication factor of about $$\alpha_i = 1 + \frac{1}{b} = 1.5$$

The factor $b$ is substantially independent of temperature. Hence the intrinsic $\alpha_i$ is very stable.

It is to be noted that a certain current in the collector body 14 is requisite in order that $\alpha$ will stabilize. For small currents some of the electron flow into the intrinsic zone 14 can occur by diffusion. If the velocity due to the current is large in comparison to the diffusion velocity, $\alpha$ will stabilize at the value indicated hereinabove. However, if the current velocity is small in comparison to the diffusion velocity then the current multiplication factor will be of different values, determinable in ways known in the art. Thus, it will be appreciated that devices constructed in accordance with this invention may be transferred from one state of stability to another, each state being characterized by a particular current multiplication factor, by control of the operating current point.

Figure 4:
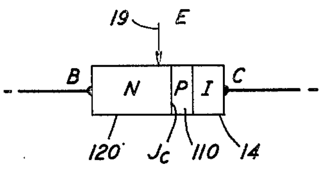
Fig. 4 depicts a transistor having a point contact emitter and a junction collector, illustrative of another embodiment of this invention.

Although in the device illustrated in Fig. 1 the semiconductive body is of NPN configuration, the invention may be embodied also in devices wherein the body is of PNP configuration. For such devices the intrinsic current multiplication factor will be $1+b$ which is about 3. Also, it may be embodied in devices, such as illustrated in Fig. 4, employing a point contact 19 as an emitter in place of the junction emitter $J_E$ as in Fig. 1. As illustrated in Fig. 4, the emitter 19 bears against the N zone 120 and the intrinsic zone 14 is contiguous with the P zone 14. Alternatively, the emitter may bear against the P zone and the zone 14 be contiguous with the N zone.

It should be noted that a given body of germanium may be intrinsic at one temperature and N-type or P-type at another. If the excess of donors over acceptors is $n_o$ and the concentration of electrons in an intrinsic specimen is $n_i(T)$, then there will be a temperature $T_o$ at which $M_i(T_o) = M_o$. If T increases above $T_o$, $n_i$ increases rapidly and the ratio of electrons to holes, which is $1+(M_o/M_i)$ approaches unity. The resulting dependence of $\alpha_i$ upon T may be used to make temperature sensitive devices. It may also be used to determine the requirements on the materials intended for operation in a particular temperature range.

What is claimed is:

1. A signal translating device comprising a body of semiconductive material having a PN junction therein, emitter and collector connections to said body on opposite sides of said junction, and a base connection to said body, said body having therein between said junction and said collector connection a zone of substantially intrinsic conductivity.

2. A signal translating device in accordance with claim 1 wherein said emitter connection includes a second PN junction.

3. A signal translating device in accordance with claim 1 wherein said emitter connection includes a point contact bearing against said body.

4. A signal translating device in accordance with claim 1 wherein said semiconductive material is germanium.

5. A signal translating device comprising a body of semiconductive material having therein an intermediate zone of one conductivity type between and contiguous with a pair of zones of the opposite conductivity type and having also a fourth zone of substantially intrinsic conductivity contiguous with one of said pair of zones, a base connection to said intermediate zone, an emitter connection to the other of said pair of zones, and a collector connection to said fourth zone.

6. A signal translating device comprising a body of semiconductive material having therein a P zone between and contiguous with a pair of N zones, said body having also a zone of substantially intrinsic conductivity contiguous with one of said N zones, and base, collector and emitter terminals on said P zone, said intrinsic zone and the other N zone respectively.

WILLIAM SHOCKLEY.
MORGAN SPARKS.

REFERENCES CITED

The following references are of record in the file of this patent:

UNITED STATES PATENTS

| Number | Name | Date |
|---|---|---|
| 2,570,978 | Pfann | Oct. 9, 1951 |
| 2,586,080 | Pfann | Feb. 19, 1952 |